(12) United States Patent
Lee (10) Patent No.: US 7,606,281 B2
(45) Date of Patent: Oct. 20, 2009

(54) METHOD OF PRODUCING MULTI-WAVELENGTH SEMICONDUCTOR LASER DEVICE

(75) Inventor: Sang Don Lee, Kyungki-Do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 211 days.

(21) Appl. No.: 11/857,906

(22) Filed: Sep. 19, 2007

(65) Prior Publication Data
US 2008/0056324 A1 Mar. 6, 2008

Related U.S. Application Data

(62) Division of application No. 10/933,531, filed on Sep. 3, 2004, now abandoned.

(51) Int. Cl.
*H01S 5/00* (2006.01)
*H01L 21/00* (2006.01)

(52) U.S. Cl. .............. 372/50.121; 372/50.12; 372/50.122; 438/29; 438/34; 438/35; 438/46; 438/47

(58) Field of Classification Search ........ 372/50.12, 372/50.121, 50.122; 438/29, 34, 35, 46, 438/47
See application file for complete search history.

(56) References Cited

U.S. PATENT DOCUMENTS

| | | | |
|---|---|---|---|
| 5,039,627 A * | 8/1991 | Menigaux et al. ............ 438/35 |
| 5,042,043 A * | 8/1991 | Hatano et al. ........... 372/45.012 |
| 5,386,428 A * | 1/1995 | Thornton et al. ......... 372/50.12 |
| 5,436,193 A * | 7/1995 | Beernink et al. ............. 438/34 |
| 5,701,321 A * | 12/1997 | Hayafuji et al. ........ 372/44.011 |
| 5,777,350 A * | 7/1998 | Nakamura et al. ............ 257/96 |
| 5,804,834 A * | 9/1998 | Shimoyama et al. .......... 257/22 |
| 6,100,546 A * | 8/2000 | Major et al. ................ 257/103 |
| 6,285,696 B1 * | 9/2001 | Bour et al. .............. 372/45.01 |
| 6,285,698 B1 * | 9/2001 | Romano et al. .......... 372/46.01 |
| 6,303,403 B1 * | 10/2001 | Sato et al. ..................... 438/29 |
| 6,323,053 B1 * | 11/2001 | Nishikawa et al. ............ 438/46 |
| 6,455,340 B1 * | 9/2002 | Chua et al. .................... 438/31 |
| 6,465,812 B1 * | 10/2002 | Hosoba et al. .............. 257/103 |

(Continued)

FOREIGN PATENT DOCUMENTS

JP 11026877 A * 1/1999

(Continued)

OTHER PUBLICATIONS

Japanese Patent Office, Office Action mailed Jan. 22, 2008 and English Translation.

*Primary Examiner*—Wael Fahmy
*Assistant Examiner*—Hrayr A Sayadian
(74) *Attorney, Agent, or Firm*—Lowe Hauptman Ham & Berner (57) ABSTRACT

A method for producing a multi-wavelength semiconductor laser device includes the steps of: forming a nitride epitaxial layer on a substrate for growth of a nitride single crystal; separating the nitride epitaxial layer from the substrate; attaching the separated nitride epitaxial layer to a first conductivity-type substrate; selectively removing the nitride semiconductor epitaxial layer to expose a portion of the first conductivity-type substrate and to form a first semiconductor laser structure; and sequentially forming second and third semiconductor laser structures on the exposed portion of the first conductivity-type substrate.

12 Claims, 7 Drawing Sheets

U.S. PATENT DOCUMENTS

| | | | |
|---|---|---|---|
| 6,480,456 B1 * | 11/2002 | Kawamura et al. | 369/120 |
| 6,967,119 B2 | 11/2005 | Morimoto et al. | |
| 6,995,406 B2 * | 2/2006 | Tojo et al. | 257/103 |
| 7,034,857 B2 * | 4/2006 | Mori et al. | 347/228 |
| 7,153,715 B2 * | 12/2006 | Ueda | 438/46 |
| 2001/0042866 A1 * | 11/2001 | Coman et al. | 257/103 |
| 2001/0050531 A1 * | 12/2001 | Ikeda | 313/498 |
| 2003/0122141 A1 * | 7/2003 | Wong et al. | 257/88 |
| 2003/0222263 A1 * | 12/2003 | Choi | 257/79 |
| 2004/0026703 A1 * | 2/2004 | Adomi et al. | 257/81 |
| 2004/0196877 A1 * | 10/2004 | Kawakami et al. | 372/23 |
| 2004/0262617 A1 * | 12/2004 | Hahm et al. | 257/79 |

FOREIGN PATENT DOCUMENTS

| | | |
|---|---|---|
| JP | 11-186651 A | 7/1999 |
| JP | 11-214798 A | 8/1999 |
| JP | 2004-153136 A | 5/2004 |
| KR | 2004-05269 | 1/2004 |

* cited by examiner

METHOD OF PRODUCING MULTI-WAVELENGTH SEMICONDUCTOR LASER DEVICE

RELATED APPLICATIONS

The present application is a division of U.S. application Ser. No. 10/933,531, filed Sep. 3, 2004 now abandoned which is based on, and claims priority from, Korea Application Number 2004-48080, filed Jun. 25, 2004, the disclosures of which are hereby incorporated be reference herein in their entirety.

BACKGROUND OF THE INVENTION

1. Field of the Invention

The present invention relates to a multi-wavelength semiconductor laser device, and more particularly to a multi-wavelength semiconductor laser device capable of simultaneously or selectively oscillating laser light of three different wavelengths (e.g., 405 nm, 650 nm and 780 nm), and a method for producing the multi-wavelength semiconductor laser device.

2. Description of the Related Art

In general, a semiconductor laser device is one that produces light amplified by stimulated emission of radiation. The light produced by the semiconductor laser device has a narrow frequency width (one of short-wavelength characteristics), superior directivity and high output. Due to these advantages, the semiconductor laser device is used as a light source for an optical pick-up apparatus of an optical disc system, such as a CD (compact disc) or DVD (digital video disc) player, as well as, is widely applied to a wide range of fields of optical communications multiplex communications, space communications and the like.

In recent years, a multi-wavelength semiconductor laser device capable of oscillating two or more different wavelengths has been required in the field of optical discs using laser as a light source for writing and reading information. For example, a two-wavelength semiconductor laser device is currently developed as a light source for both CD players having a relatively low data density and DVD players having a relatively high data density.

FIGS. 1a to 1g are cross-sectional views illustrating the overall procedure of a conventional method for producing a two-wavelength semiconductor laser device.

Figure 1A:
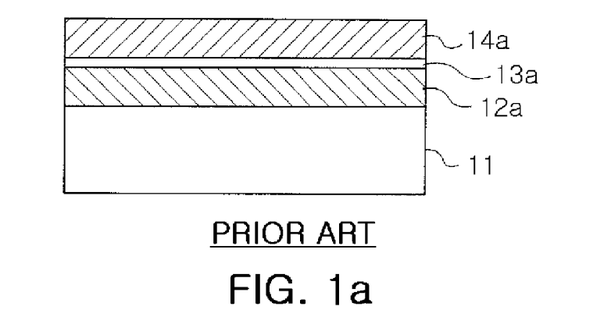
FIGS. 1a to 1g are cross-sectional views illustrating the overall procedure of a conventional method for producing a two-wavelength semiconductor laser device.

Referring to FIG. 1a, a first semiconductor laser epitaxial layer oscillating light at a wavelength of 780 nm is formed on an n-type GaAs substrate 11. Specifically, the first semiconductor laser epitaxial layer is formed by sequentially growing an n-type AlGaAs clad layer 12a, an AlGaAs active layer 13a and a p-type AlGaAs clad layer 14a on the GaAs substrate 11.

Figure 1B:
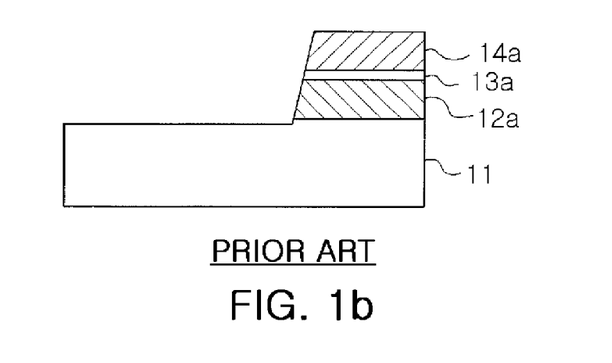

Thereafter, the first semiconductor laser epitaxial layer, including the layers 12a, 13a and 14a, is selectively removed by photolithography and etching to expose a portion of a top surface of the GaAs substrate 11, as shown in FIG. 1b.

Figure 1C:
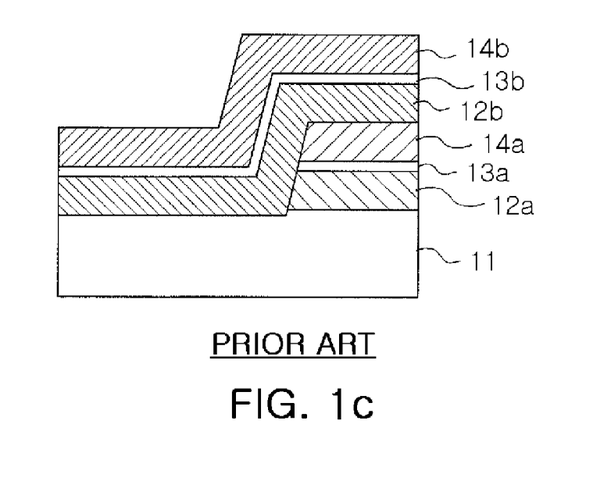

Next, as shown in FIG. 1c, a second semiconductor laser epitaxial layer oscillating light at a wavelength of 650 nm is formed on the exposed portion of the GaAs substrate 11 and the unremoved portion of the first semiconductor laser epitaxial layer. Specifically, the second semiconductor laser epitaxial layer is formed by sequentially growing an n-type AlGaInP clad layer 12b, a GaInP/AlGaInP active layer 13b and a p-type AlGaInP clad layer 14b.

Figure 1D:
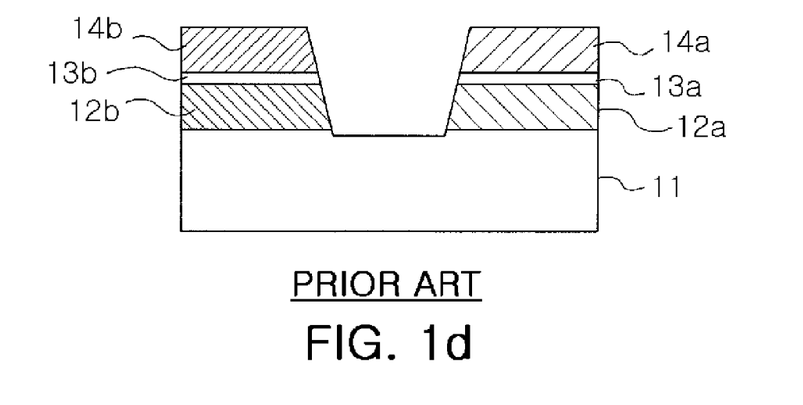

Thereafter, the second semiconductor laser epitaxial layer, including the layers 12b, 13b and 14b, formed on the first semiconductor laser epitaxial layer is removed by photolithography and etching, and at the same time, the first epitaxial layer is separated from the second epitaxial layer, as shown in FIG. 1d.

Figure 1E:
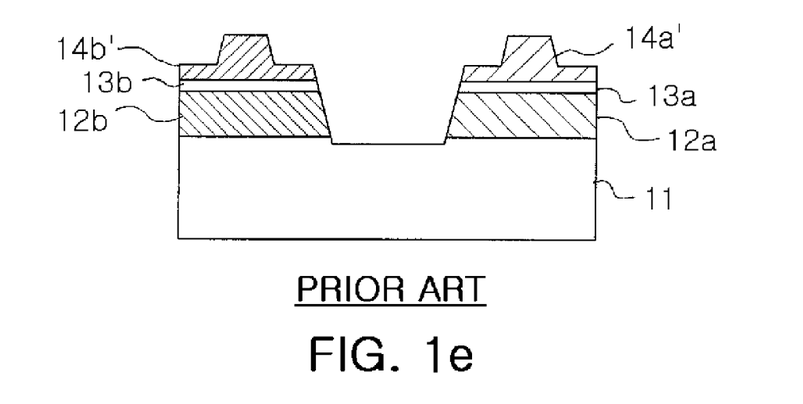
Figure 1F:
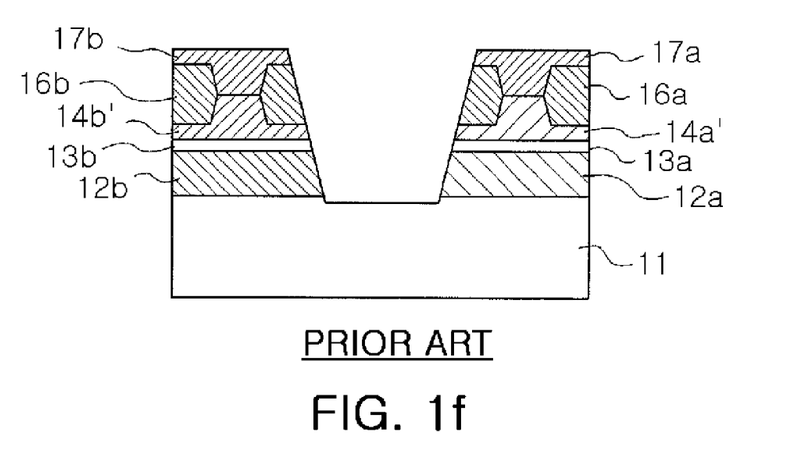

Next, as shown in FIG. 1e, the p-type AlGaAs clad layer 14a and the p-type AlGaInP clad layer 14b are selectively etched by a common process to form ridge-shaped layers 14a' and 14b', which contribute to an improvement in current injection efficiency. Then, as shown in FIG. 1f, n-type GaAs current-limiting layers 16a and 16b and p-type GaAs contact layers 17a and 17b are formed.

Figure 1G:
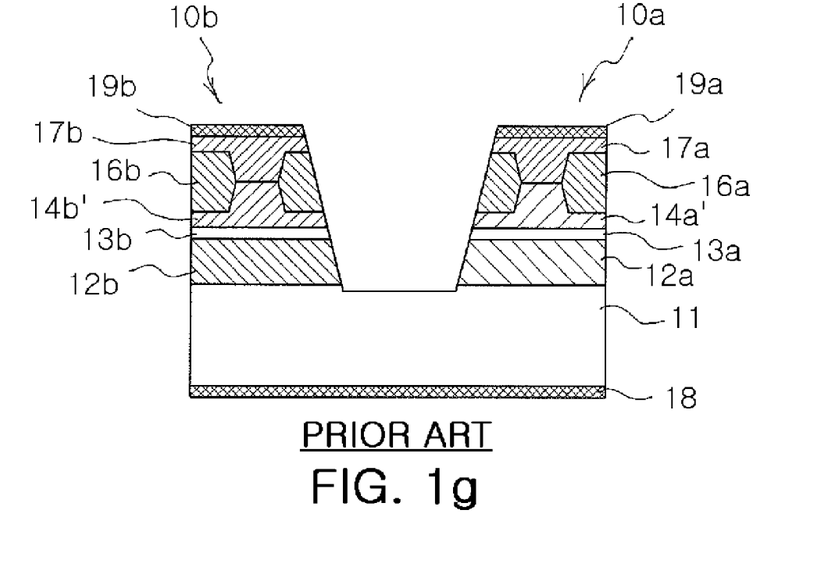

Finally, as shown in FIG. 1g, p-side electrodes 19a and 19b formed of Ti, Pt, Au or an alloy thereof are formed on the p-type GaAs contact layers 17a and 17b, respectively, and then an n-side electrode 18 formed of Au/Ge, Au, Ni or an alloy thereof is formed on a bottom surface of the GaAs substrate 11 to produce the two-wavelength semiconductor laser device 10.

In this manner, the semiconductor laser device 10 oscillating light of two different wavelengths is produced on a single substrate, enabling integration into one chip. Accordingly, the conventional method is advantageous compared to a method wherein respective semiconductor laser devices are separately produced, and are then attached to one substrate by die bonding, in terms of the following advantages: i) the separate production and bonding processes are omitted, thus shortening the overall production procedure, and ii) poor alignment caused during die bonding of chip can be solved.

As explained earlier in FIGS. 1a to 1g, the conventional method is limited to the two-wavelength (650 nm and 780 nm) semiconductor laser device, and thus cannot be applied to a three-wavelength (further including light of a short wavelength) semiconductor laser device. A three-wavelength semiconductor laser device commonly required in the art is one which can oscillate light both at wavelengths of 650 nm and 780 nm, and at a shorter wavelength of 405 nm. In this connection, there is a problem that since a GaN-based epitaxial layer is required to produce a semiconductor laser structure oscillating light at a wavelength of 405 nm, the three semiconductor laser structures of the three-wavelength semiconductor laser device cannot be formed on the same substrate.

More specifically, since the lattice constant of an AlGaAs epitaxial layer for the semiconductor laser structure oscillating light at a wavelength of 650 nm is similar to that (about 5.6 Å) of an AlGaInP epitaxial layer for the semiconductor laser structure oscillating light at a wavelength of 750 nm, they can be grown on the same substrate, such as a GaAs substrate. However, since there is a large difference in the lattice constant between the AlGaInP epitaxial layer and an GaN epitaxial layer (about 3.2 Å) for the semiconductor laser structure oscillating light at 405 nm, many crystal defects occur while the epitaxial layers are grown on a GaAs substrate, which makes practical application difficult. In other words, since substrates inherent in the growth of a nitride semiconductor, such as GaN, sapphire and SiC substrates, are required in order to grow the GaN epitaxial layer thereon, a multi-wavelength semiconductor laser device oscillating light, for example, at wavelengths of 650 nm, 780 nm and 405 nm, cannot be substantially produced by the conventional method for producing a two-wavelength semiconductor laser device.

SUMMARY OF THE INVENTION

Therefore, the present invention has been made in view of the above problems, and it is an object of the present invention to provide a method for producing a multi-wavelength semiconductor laser device oscillating light of three different wavelengths by growing GaN epitaxial layers on a separate substrate, followed by separation and attachment.

It is another object of the present invention to provide a multi-wavelength semiconductor laser device having a novel structure which is produced by the method.

In order to accomplish the above objects of the present invention, there is provided a method for producing a multi-wavelength semiconductor laser device, comprising the steps of: preparing a substrate for growth of a nitride single crystal thereon; sequentially growing a first conductivity-type first clad layer, a first active layer and a second conductivity-type first clad layer on the substrate, to form a nitride epitaxial layer; separating the nitride epitaxial layer from the substrate; attaching the separated nitride epitaxial layer to a first conductivity-type substrate; selectively removing the nitride epitaxial layer such that a portion of the substrate is exposed, to form a first semiconductor laser structure; sequentially growing a first conductivity-type second clad layer, a second active layer and a second conductivity-type second clad layer on the exposed portion of the first conductivity-type substrate, to form a second semiconductor laser structure separated from the first semiconductor laser structure; sequentially growing a first conductivity-type third clad layer, a third active layer and a second conductivity-type third clad layer on the remaining portion of the top surface of the first conductivity-type substrate, to form a third nitride epitaxial layer separated from the first and second semiconductor laser structures; and forming a first electrode connected to a bottom surface of the first conductivity-type substrate and forming second electrodes connected to the respective second conductivity-type clad layers of the first, second and third semiconductor laser structures.

In a preferred embodiment of the present invention, the method of the present invention further comprises the steps of: selectively etching the respective second conductivity-type clad layers of the first, second and third semiconductor laser structures, after the formation of the third semiconductor laser structure and before the formation of the first electrode and the second electrodes, to form ridge-shaped layers, and forming an insulating layer on top surfaces of the second conductivity-type clad layers except for top ends of the ridge-shaped layers. In this case, the second electrodes can be connected to the respective second conductivity-type clad layers through the top ends of the ridge-shaped layers.

The insulating layer may be formed in such a manner that it is extended to side faces of the first, second and third semiconductor laser structures. The insulating layer may be formed of $SiO_2$ or $Si_3N_4$.

Further, the separation of the nitride epitaxial layer from the substrate can be performed by irradiating the bottom surface of the substrate with laser light to lift-off the nitride epitaxial layer. In this case, the method of the present invention may further comprise the step of lapping the bottom surface of the substrate, before the laser irradiation, to decrease the thickness of the substrate.

Further, the attachment of the nitride epitaxial layer to the first conductivity-type substrate can be performed by applying pressure to the separated nitride epitaxial layer on a top surface of the first conductivity-type substrate at high temperature.

In another embodiment of the present invention, the step of forming the second semiconductor laser structure comprises the sub-steps of: sequentially growing the first conductivity-type second clad layer, the second active layer and the second conductivity-type second clad layer on the top surface of the first conductivity-type substrate on which the first semiconductor laser structure is formed, to form an epitaxial layer for the second semiconductor laser structure; and selectively removing the epitaxial layer for the second semiconductor laser structure, to form the second semiconductor laser structure separated from the first semiconductor laser structure on a portion of the first conductivity-type substrate.

Similarly to this, the step of forming the third semiconductor laser structure comprises the sub-steps of: sequentially growing the first conductivity-type third clad layer, the third active layer and the second conductivity-type third clad layer on the top surface of the first conductivity-type substrate on which the first and second semiconductor laser structures are formed, to form an epitaxial layer for the third semiconductor laser structure; and selectively removing the epitaxial layer for the third semiconductor laser structure, to form the third semiconductor laser structure separated from the first and second semiconductor laser structures on a portion of the top surface of the first conductivity-type substrate.

It is preferable that the first, second and third semiconductor laser structures are formed in this order from one side of the first conductivity-type substrate. The substrate for growth of a nitride single crystal may be a sapphire, SiC, or GaN substrate, and the nitride epitaxial layer may be formed of a GaN-based semiconductor material.

Further, the first conductivity-type substrate may be a first conductivity-type GaAs substrate, the epitaxial layer for the second semiconductor laser structure may be formed of an AlGaAs-based semiconductor material, and the epitaxial layer for the third semiconductor laser structure may be formed of an AlGaInP-based semiconductor material.

In accordance with another aspect of the present invention, there is provided a three-wavelength semiconductor laser device having a novel structure. The semiconductor laser device comprises: a first conductivity-type substrate having a top surface divided into first, second and third regions; a first semiconductor laser structure including a first conductivity-type GaN-based clad layer, a GaN-based active layer and a second conductivity-type GaN-based clad layer sequentially formed on the first region of the first conductivity-type substrate; a second semiconductor laser structure including a first conductivity-type AlGaAs-based clad layer, an AlGaAs-based active layer and a second conductivity-type AlGaAs-based clad layer sequentially formed on the second region of the first conductivity-type substrate; a third semiconductor laser structure including a first conductivity-type AlGaInP-based clad layer, an AlGaInP-based active layer and a second conductivity-type AlGaInP-based clad layer sequentially formed on the third region of the first conductivity-type substrate; and a first electrode connected to a bottom surface of the first conductivity-type substrate and second electrodes connected to the respective second conductivity-type clad layers of the first, second and third semiconductor laser structures.

Preferably, the respective second conductivity-type clad layers of the first, second and third semiconductor laser structures are formed into ridge-shaped layers, and the first, second and third semiconductor laser structures further include an insulating layer formed on top surfaces of the second conductivity-type clad layers except for top ends of the ridge-shaped layers. At this time, the second electrodes are connected to the respective second conductivity-type clad layers through the respective top ends of the ridge-shaped layers.

In order to integrate the semiconductor laser structures composed of the respective epitaxial layers, which are grown under different conditions, into one chip, the multi-wavelength semiconductor laser device of the present invention is produced by forming the nitride epitaxial layer for the first semiconductor laser structure oscillating light of a short wavelength, separating the nitride epitaxial layer, attaching the separated epitaxial layer to the first conductivity-type substrate, and forming the second and third semiconductor laser structures on the first conductivity-type substrate. Particularly, according to the method of the present invention, since the nitride epitaxial layer grown at a relatively high temperature are formed, separated from the substrate and attached to the first conductivity-type substrate, unwanted effects (diffusion of dopants, thermal shock, etc.) of the other layers during the subsequent epitaxial growth step are reduced. In addition, since etching is performed to form the semiconductor laser structures on the same substrate, a multi-wavelength semiconductor laser device in which the respective laser structures are highly aligned, can be produced.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Detailed description will be made of the preferred embodiment of the present invention with reference to the accompanying drawings.

FIGS. 2a to 2k are cross-sectional views illustrating the overall procedure of a method for producing a three-wavelength semiconductor laser device according to a preferred embodiment of the present invention.

Figure 2A:
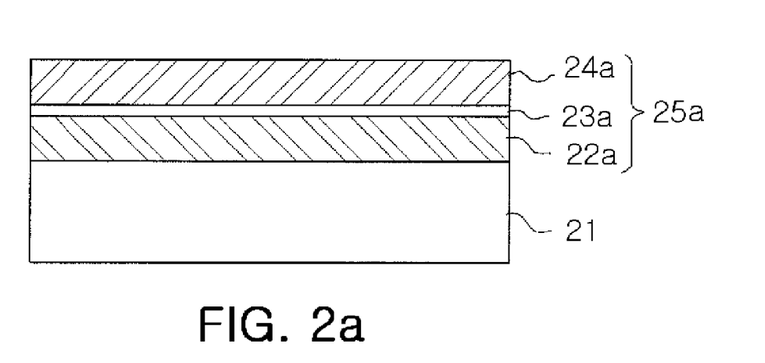
FIGS. 2a to 2k are cross-sectional views illustrating the overall procedure of a method for producing a three-wavelength semiconductor laser device according to the present invention.

As shown in FIG. 2a, a nitride epitaxial layer 25a for a semiconductor laser structure oscillating light of a short wavelength (e.g., 405 nm) is formed on a sapphire substrate 21. The nitride epitaxial layer 25a can be formed by sequentially growing a first conductivity-type first clad layer 22a, a first active layer 23a and a second conductivity-type first clad layer 24a. The first conductivity-type first clad layer 22a may be composed of an n-type $Al_{0.1}Ga_{0.9}N$ layer and an n-type GaN layer, and the second conductivity-type first clad layer 24a may be composed of a p-type $Al_{0.1}Ga_{0.9}N$ layer and a p-type GaN layer. The active layer 23a may have a multi-quantum well structure formed of $In_{0.2}Ga_{0.8}N/In_{0.05}Ga_{0.95}N$.

The nitride epitaxial layer 25a can be formed by conventional growth processes, e.g., metal organic chemical vapor deposition (MOCVD) and molecular beam epitaxial (MBE) deposition. Instead of the sapphire substrate 21, known substrates for growth of a nitride semiconductor, for example, GaN and SiC substrates, can be used.

Figure 2B:
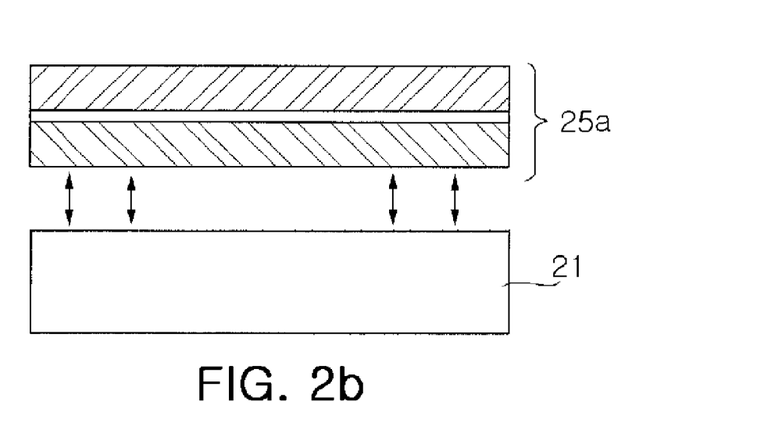

As shown in FIG. 2b, the nitride epitaxial layer 25a is separated from the sapphire substrate 21. This separation can be performed by well-known processes, such as lift-off, dry-etching, lapping and combinations thereof. For example, the lift-off process using laser light can be performed by irradiating the bottom surface of the substrate 21 with an Nd—YAG laser at 5 eV or higher to melt a crystal layer present in the vicinity of the interface between the nitride epitaxial layer 25a and the sapphire substrate 21, thereby easily lifting-off the nitride epitaxial layer 25a. On the other hand, the dry-etching or lapping process can be used to chemically or mechanically separate the sapphire substrate 21. In addition, these dry-etching or lapping processes can be combined with the lift-off process using laser light. As a preferred example, the thickness of the substrate 21 is decreased by the lapping process, and then the nitride epitaxial layer 25a is separated from the substrate 21 by laser irradiation.

Figure 2C:
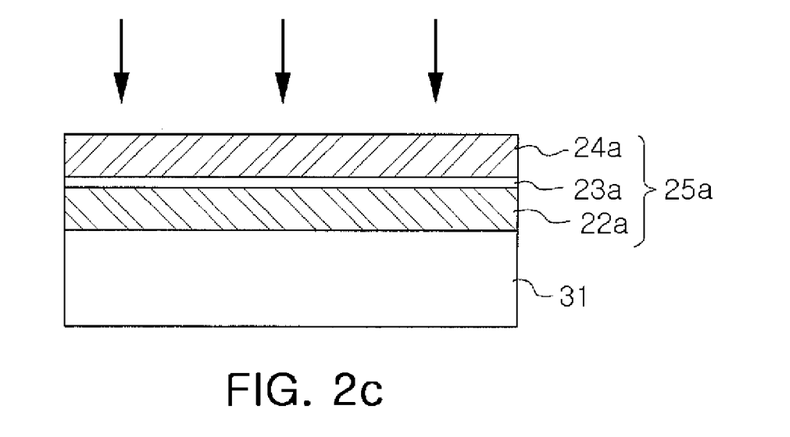

Next, as shown in FIG. 2c, the separated nitride epitaxial layer 25a is attached to a first conductivity-type substrate 31. The first conductivity-type substrate 31 may be an n-type GaAs substrate suitable as a substrate for growth of an epitaxial layer to be grown later. This attachment may be performed using a conductive adhesive, and is preferably performed by applying a predetermined pressure to the separated nitride epitaxial layer 25a on the first conductivity-type substrate 31 at high temperature. For example, the nitride epitaxial layer 25a is arranged on the first conductivity-type substrate 31, and then the resulting structure is heated at 500° C. for about 20 minutes under a pressure of at 5 kg/cm$^2$ to attach the nitride epitaxial layer 25a to the n-type GaAs substrate 31. This produces an adhesive free, heat bond between the nitride epitaxial layer 25a and the n-type GaAs substrate 31.

Figure 2D:
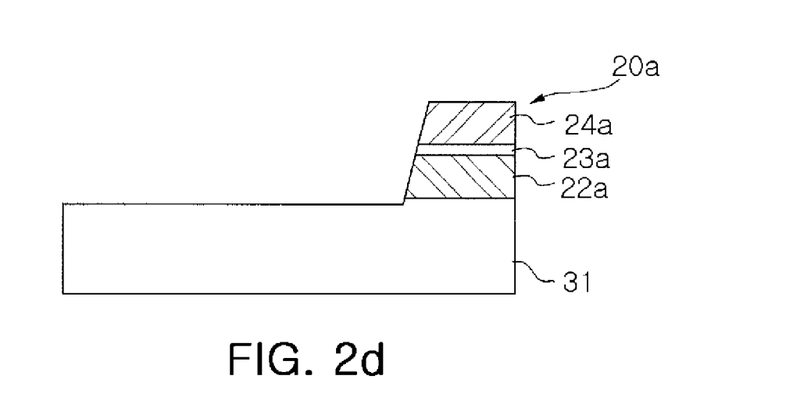

Thereafter, as shown in FIG. 2d, the nitride epitaxial layer (25a in FIG. 2c) is selectively removed by photolithography and dry etching to expose a portion of the first conductivity-type substrate 31. As a result of etching, the nitride epitaxial layer (25a in FIG. 2c) can be formed into a first semiconductor laser structure 20a. The top surface of the first conductivity-type substrate 31 exposed by etching is provided as a region where second and third semiconductor laser structures are formed through subsequent steps.

Specifically, a first conductivity-type second clad layer 22b, a second active layer 23b and a second conductivity-type second clad layer 24b are sequentially grown on a portion of the top surface of the first conductivity-type substrate 31 such that the first and the second semiconductor laser structures 20a and 20b are separated from each other. In this manner, a second semiconductor laser structure 20b is formed on the first conductivity-type substrate (see, FIG. 2f). In addition, a first conductivity-type third clad layer 22c, a third active layer 23c and a second conductivity-type third clad layer 24c are sequentially grown on a portion of the top surface of the first conductivity-type substrate 31 such that the first and the second semiconductor laser structures 20a and 20b are separated from each other. In this manner, a third semiconductor laser structure 20c is formed on the first conductivity-type substrate (see, FIG. 2h)

The formation of the second and third semiconductor laser structures will be explained below with reference to FIGS. 2e to 2h.

Figure 2E:
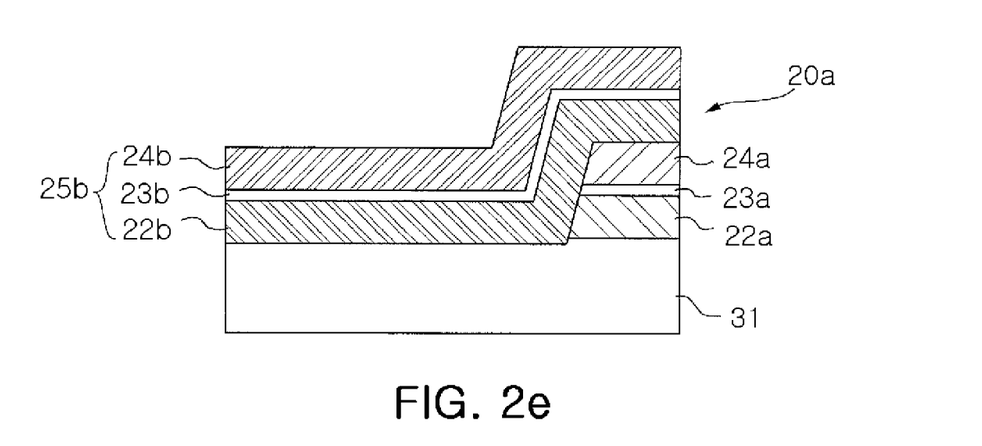

Next, an epitaxial layer 25b for the second semiconductor laser structure is formed on the first conductivity-type substrate 31 on which the first semiconductor laser structure 20a is formed, as shown in FIG. 2e. The epitaxial layer 25b for the second semiconductor laser structure can be formed by sequentially growing the first conductivity-type second clad layer 22b, the second active layer 23b and the second conductivity-type second clad layer 24b. In the case where the epitaxial layer 25b is designed for a semiconductor laser structure oscillating light at a wavelength of 780 nm, the first and second conductivity-type second clad layers 22b and 24b may be composed of n-type and p-type $Al_{0.5}Ga_{0.5}As$ layers, respectively. The active layer 23b may have a multi-quantum well structure composed of $Al_{0.1}Ga_{0.9}As/Al_{0.35}Ga_{0.65}As$.

Figure 2F:
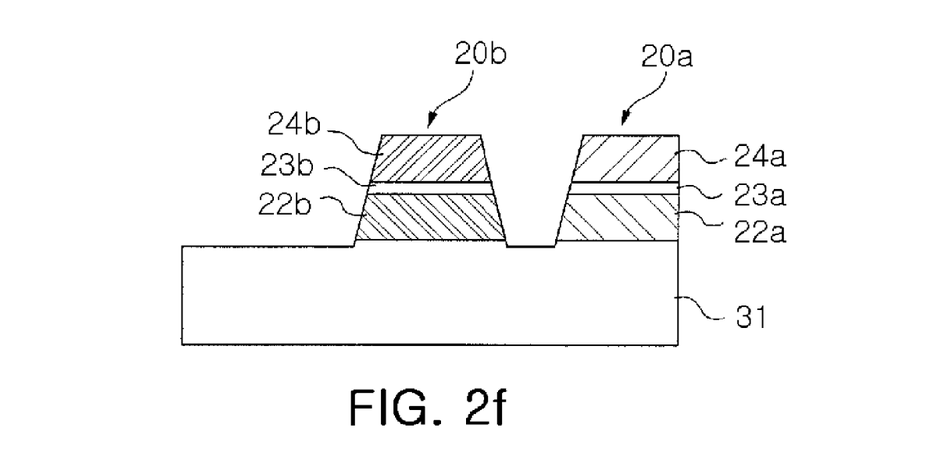

Thereafter, as shown in FIG. 2f, the AlGaAs-based epitaxial layer 25b is selectively etched in such a manner that the second semiconductor laser structure 20b is formed on a portion of the top surface of the first conductivity-type substrate 31. Portions of the AlGaAs-based epitaxial layer 25b formed on the top surface of the first semiconductor laser structure 20a and between the first and second semiconductor laser structures 20a and 20b are removed by etching, such that the first and second semiconductor laser structures 20a and 20b are separated from each other. In addition, the AlGaAs epitaxial layer 25b formed on the exposed portion of the top surface of the first conductivity-type substrate 31 is removed to partially re-expose the top surface of the first conductivity-type substrate 31.

Figure 2G:
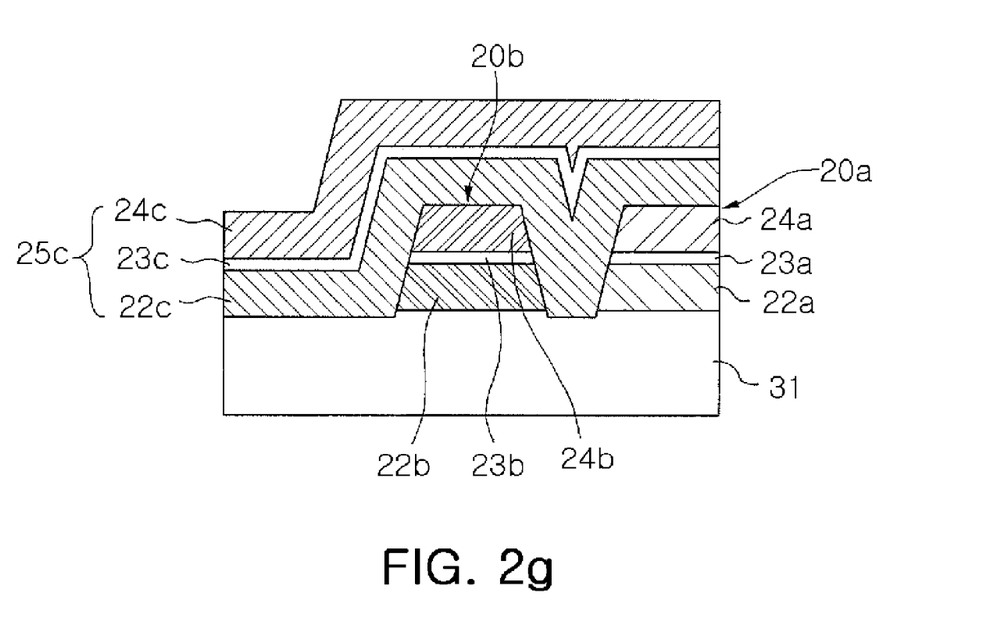

Next, an epitaxial layer 25c for the third semiconductor laser is formed on the first conductivity-type substrate 31 on which the first and second laser structures 20a and 20b, as shown in FIG. 2g. The epitaxial layer 25c for the third semiconductor structure can be formed by sequentially growing the first conductivity-type third clad layer 22c, the third active layer 23c and the second conductivity-type third clad layer 24c. In the case where the epitaxial layer 25c is designed for a semiconductor laser structure oscillating light at a wavelength of 650 nm, the first and second conductivity-type second clad layers 22c and 24c may be composed of n-type and p-type $(Al_{0.7}Ga_{0.3})In_{0.5}P$ layers, respectively. The active layer 23c may have a multi-quantum well structure composed of $InGaP/(Al_{0.5}Ga_{0.5})_{0.5}In_{0.5}P$.

Figure 2H:
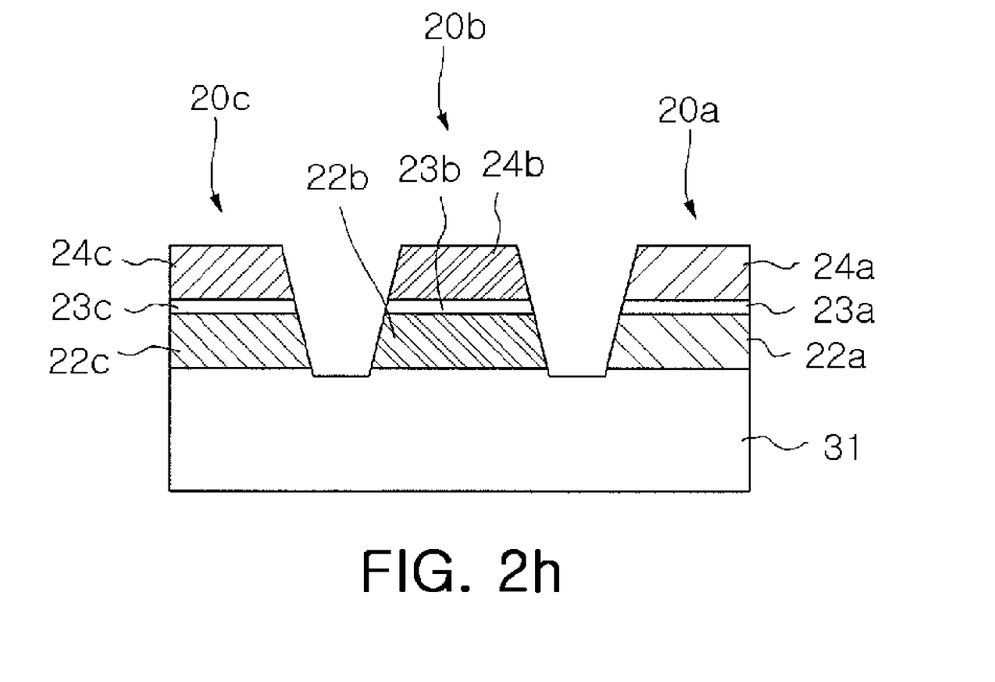

Thereafter, as shown in FIG. 2h, the AlGaInP-based epitaxial layer 25c is selectively etched in such a manner that the third semiconductor laser structure 20c is formed on a portion of the top surface of the first conductivity-type substrate 31. Portions of the AlGaInP-based epitaxial layer 25c formed on the top surfaces of the first and the second semiconductor laser structures 20a and 20b and between the respective semiconductor laser structures 20a, 20b and 20c are selectively removed by etching, such that the first, second and third semiconductor laser structures 20a, 20b and 20c are separated from one another.

Figure 2I:
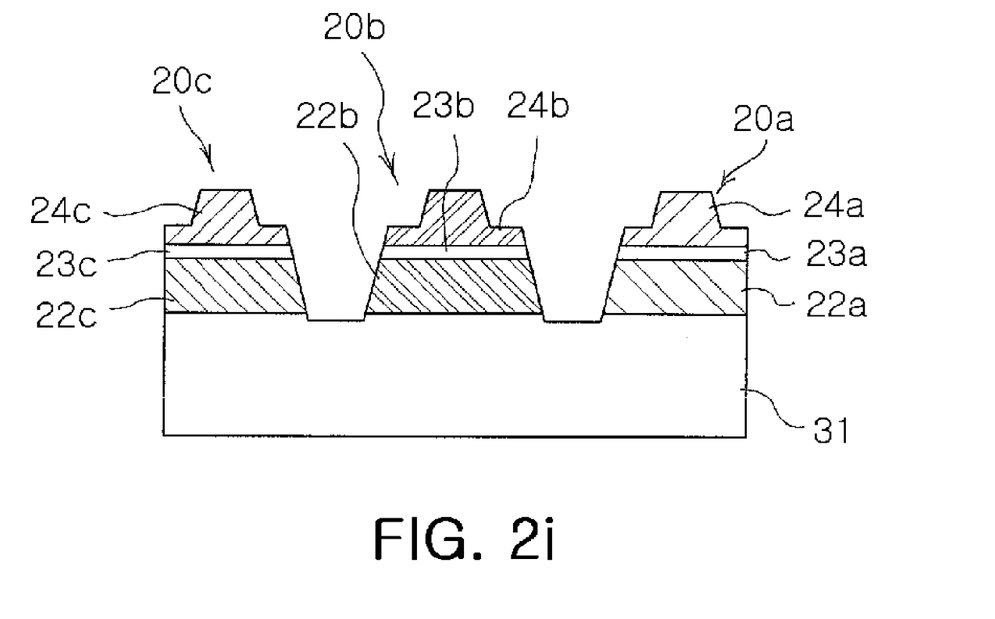

In addition, etching is preferably performed to form the respective second conductivity-type clad layers 24a, 24b and 24c of the first, the second and the third semiconductor laser structures 20a, 20b and 20c into ridge-shaped layers, as shown in FIG. 2i. The width between the ridge-shaped layers may be about 2 m to about 7 m. This ridge structure can increase the efficiency of current injected through the second conductivity-type clad layers 24a, 24b and 24c.

Figure 2J:
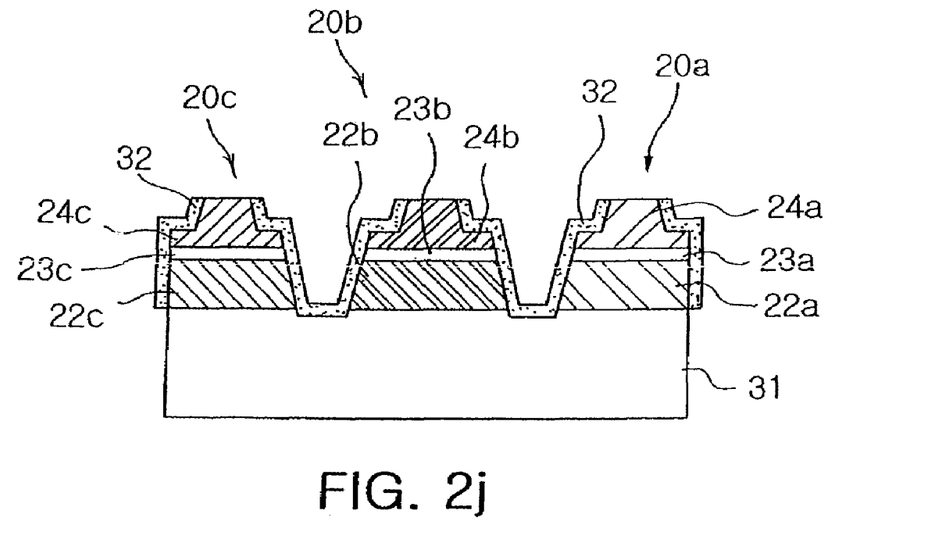

Next, as shown in FIG. 2j, an insulating layer 32 is formed on the top surfaces of the second conductivity-type clad layers 24a, 24b and 24c except for top ends of the ridge-shaped layers. The insulating layer 32 acts as a current-limiting layer. Preferably, the insulating layer 32 may be formed in such a manner that it is extended to side faces of the first, second and third semiconductor laser structures 20a, 20b and 20c and the overall faces of the substrate 31. Thus, the insulating layer 32 can be used as a common passivation layer, as well as a current-limiting layer. The insulating layer 32 may be formed of $SiO_2$ or $Si_3N_4$.

Figure 2K:
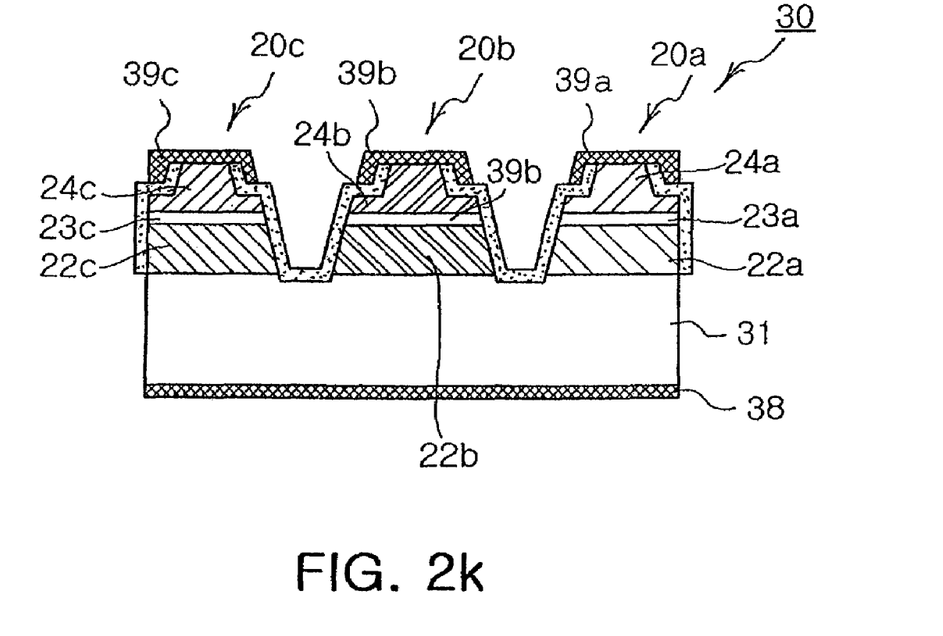

Referring finally to FIG. 2k, a first electrode 38 is formed on a bottom surface of the first conductivity-type substrate 31, and second electrodes 39a, 39b and 39c are formed in such a manner that they are connected to the respective second conductivity-type clad layers 24a, 24b and 24c of the first, second and third semiconductor laser structures 20a, 20b and 20c. In this embodiment, the second electrodes 39a, 39b and 39c can be formed on top surfaces of the respective semiconductor laser structures 20a, 20b and 20c such that they are connected to the respective second conductivity-type clad layers 24a, 24b and 24c through the top surfaces of the ridge-shaped layers. The first electrode 38 may be formed of Au/Ge, Au, Ni or an alloy thereof, and the second electrodes 39a, 39b and 39c may be formed of at least one metal selected from the group consisting of Ti, Pt, Ni and Au. In this manner, a three-wavelength semiconductor laser device 30 in which the three semiconductor laser structures 20a, 20b and 20c oscillating light of the respective inherent wavelengths are arranged on the same substrate 31, can be produced.

As shown in FIG. 2k, according to the semiconductor laser device 30 capable of oscillating three-wavelength light, the first semiconductor laser structure 20a formed of a GaN-based material, the second semiconductor laser structure 20b formed of an AlGaAs-based material, and the third semiconductor laser structure 20c formed of an AlGaInP-based material can be integrated into one chip. The first semiconductor laser structure 20a formed of a GaN-based material is grown on a separate substrate for growth of a nitride semiconductor, separated from the substrate and attached to the first conductivity-type substrate 31. For easy growth of the second and third semiconductor laser structures 20b and 20c, the first semiconductor laser structure 20a is preferably arranged at one side of the first conductivity-type substrate 31. Furthermore, the second and third semiconductor laser structures 20b and 20c are preferably arranged in this order in order that they grow from the side where the first semiconductor laser structure 20a is arranged.

In the case where ridge-shaped layers and a current-limiting layer are employed, the insulating layer 32 of the respective second conductivity-type clad layers 24a, 24b and 24c is provided as a current-limiting layer. Since the second conductivity-type first clad layers (formed of a GaN-based material) are grown under different conditions, a conventional current-limiting layer formed by reverse attachment has a limitation in its simultaneous formation on the three semiconductor laser structures. Accordingly, the present invention suggests the use of the insulating layer 32 as a current-limiting layer to simultaneously form the current-limiting layer on the three semiconductor laser structures. The insulating layer is extended to side faces of the respective semiconductor laser structures 20a, 20b and 20c, and thus acts as a passivation layer of the respective semiconductor laser structures.

Although the present invention has been described herein with reference to the foregoing examples and the accompanying drawings, the scope of the present invention is defined by the claims that follow. Accordingly, those skilled in the art will appreciate that various substitutions, modifications and changes are possible, without departing from the technical spirit of the present invention as disclosed in the accompanying claims. It is to be understood that such substitutions, modifications and changes are within the scope of the present invention.

As apparent from the above description, according to the method for producing a three-wavelength semiconductor laser device including a GaN-based semiconductor laser structure, such as a semiconductor laser oscillating light at a wavelength of 405 nm, after the GaN-based semiconductor laser structures is grown on a substrate for growth of a nitride semiconductor, separated from the substrate and attached to a first conductivity-type substrate (e.g., a GaAs substrate), semiconductor laser structures oscillating light of two different wavelengths are formed on the first conductivity-type substrate. Accordingly, the semiconductor laser structures, which cannot be grown on a single substrate, can be integrated into one chip.

In addition, since epitaxial layers for the respective semiconductor laser structures are formed on the final substrate, the three-wavelength semiconductor laser device can be produced in a simpler manner, without causing poor alignment during attachment of the semiconductor laser structures.

What is claimed is:

1. A method for producing a multi-wavelength semiconductor laser device, comprising the steps of:
   preparing a substrate for growth of a nitride single crystal thereon;
   sequentially growing a first conductivity-type first clad layer, a first active layer and a second conductivity-type first clad layer on the substrate, to form a nitride epitaxial layer;
   separating the nitride epitaxial layer from the substrate;
   attaching the separated nitride epitaxial layer to a first conductivity-type substrate;
   selectively removing the nitride epitaxial layer such that a portion of the substrate is exposed, to form a first semiconductor laser structure;
   sequentially growing a first conductivity-type second clad layer, a second active layer and a second conductivity-type second clad layer on the exposed portion of the first conductivity-type substrate, to form a second semiconductor laser structure separated from the first semiconductor laser structure;
   sequentially growing a first conductivity-type third clad layer, a third active layer and a second conductivity-type third clad layer on the remaining portion of the first conductivity-type substrate, to form a third semiconductor laser structure separated from the first and second semiconductor laser structures; and
   forming a first electrode connected to a bottom surface of the first conductivity-type substrate and forming second electrodes connected to the respective second conductivity-type clad layers of the first, second and third semiconductor laser structures.

2. The method according to claim 1, further comprising the steps of: selectively etching the respective second conductivity-type clad layers of the first, second and third semiconductor laser structures, after the formation of the third semiconductor laser structure and before the formation of the first electrode and the second electrodes, to form ridge-shaped layers, and forming an insulating layer on top surfaces of the second conductivity-type clad layers except for top ends of the ridge-shaped layers wherein the second electrodes are connected to the respective second conductivity-type clad layers through the top ends of the ridge-shaped layers.

3. The method according to claim 2, wherein the insulating layer is formed in such a manner that it is extended to side faces of the first, second and third semiconductor laser structures.

4. The method according to claim 2, wherein the insulating layer is formed of $SiO_2$ or $Si_3N_4$.

5. The method according to claim 1, wherein the separation of the nitride epitaxial layer from the substrate is performed by irradiating the bottom surface of the substrate with laser light to lift-off the nitride epitaxial layer.

6. The method according to claim 5, wherein the step of separating the nitride epitaxial layer comprises the sub-step of lapping the bottom surface of the substrate for growth of a nitride single crystal, before the laser irradiation, to decrease the thickness of the substrate.

7. The method according to claim 1, wherein the attachment of the nitride epitaxial layer to the first conductivity-type substrate is performed by pressuring the nitride epitaxial layer on a top surface of the first conductivity-type substrate at high temperature.

8. The method according to claim 1, wherein the step of forming the second semiconductor laser structure comprises the sub-steps of:
   sequentially growing the first conductivity-type second clad layer, the second active layer and the second conductivity-type second clad layer on the top surface of the first conductivity-type substrate on which the first semiconductor laser structure is formed, to form an epitaxial layer for the second semiconductor laser structure; and
   selectively removing the epitaxial layer for the second semiconductor laser structure, to form the second semiconductor laser structure separated from the first semiconductor laser structure on a portion of the first conductivity-type substrate.

9. The method according to claim 1, wherein the step of forming the third semiconductor laser structure comprises the sub-steps of:
   sequentially growing the first conductivity-type third clad layer, the third active layer and the second conductivity-type third clad layer on the top surface of the first conductivity-type substrate on which the first and second semiconductor laser structures are formed, to form an epitaxial layer for the third semiconductor laser structure; and
   selectively removing the epitaxial layer for the third semiconductor laser structure, to form the third semiconductor laser structure separated from the first and second semiconductor laser structures on a portion of the top surface of the first conductivity-type substrate.

10. The method according to claim 1, wherein the first, second and third semiconductor laser structures are formed in this order from one side of the first conductivity-type substrate.

11. The method according to claim 1, wherein the substrate for growth of a nitride single crystal is a sapphire, SiC, or GaN substrate, and the nitride epitaxial layer is formed of a GaN-based semiconductor material.

12. The method according to claim 1, wherein the first conductivity-type substrate is a first conductivity-type GaAs substrate, the epitaxial layer for the second semiconductor laser structure is formed of an AlGaAs-based semiconductor material, and the epitaxial layer for the third semiconductor laser structure is formed of an AlGaInP-based semiconductor material.

* * * * *